(12) United States Patent
Alfke et al.

(10) Patent No.: US 6,734,703 B1
(45) Date of Patent: May 11, 2004

(54) CIRCUITS AND METHODS FOR ANALYZING TIMING CHARACTERISTICS OF SEQUENTIAL LOGIC ELEMENTS

(75) Inventors: Peter H. Alfke, Los Altos Hills, CA (US); Himanshu J. Verma, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/198,801

(22) Filed: Jul. 19, 2002

(51) Int. Cl.[7] ............... H03K 19/173; H03K 19/00; G01R 31/28
(52) U.S. Cl. ............... 326/38; 326/16; 714/726
(58) Field of Search ............... 326/38, 37, 39–41, 326/46–47, 16; 327/270, 276; 714/726

(56) References Cited

U.S. PATENT DOCUMENTS

| 6,150,863 | A | * | 11/2000 | Conn et al. | ............... 327/270 |
| 6,233,205 | B1 | | 5/2001 | Wells et al. | |
| 6,239,611 | B1 | * | 5/2001 | Matera | ............... 326/16 |
| 6,314,539 | B1 | * | 11/2001 | Jacobson et al. | ............... 714/727 |

* cited by examiner

*Primary Examiner*—Jean Jeanglaude
*Assistant Examiner*—James A Cho
(74) *Attorney, Agent, or Firm*—Arthur J. Bebiel; Edel M. Young; Justin Liu (57) ABSTRACT

Described are systems and methods for quickly and accurately determining the set-up and hold-time requirements and clock-to-out delays associated with sequential logic elements on programmable logic devices. Programmable interconnect resources are configured to deliver signals to the data and clock terminals of each logic element under test. One or more variable delay circuits precisely place edges of the test signals on the elements of interest while a tester monitors the data clocked into the logic element to determine whether the logic element functions properly. This process is repeated for a number of selected delays.

18 Claims, 6 Drawing Sheets

CIRCUITS AND METHODS FOR ANALYZING TIMING CHARACTERISTICS OF SEQUENTIAL LOGIC ELEMENTS

BACKGROUND

"Set-up time" and "hold time" describe the timing requirements on the data input of a sequential logic element, such as a flip-flop or register, with respect to a clock input. The set-up and hold times define a window of time during which data must be stable to guarantee predictable performance over a full range of operating conditions and manufacturing tolerances.

Figure 1:
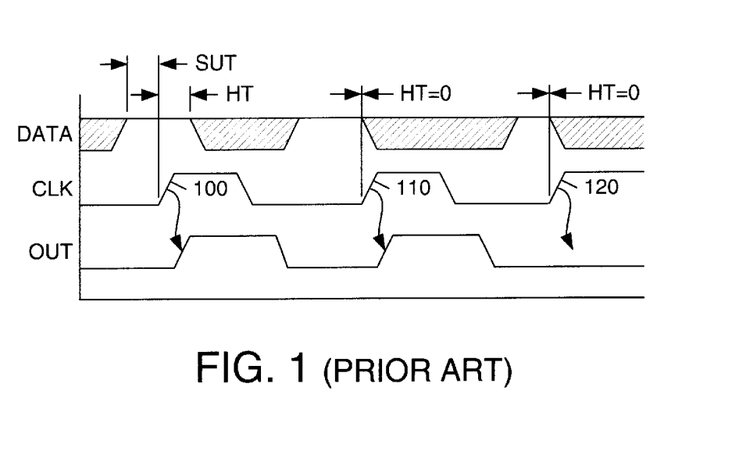
FIG. 1 (prior art) illustrates three clock-to-data timing relationships used to describe the relationships between set-up time, hold time, and a clock edge.

FIG. 1 illustrates three clock-to-data timing relationships used to describe the relationships between setup time, hold time, and a clock edge. Referring to the first example, the set-up time SUT is the length of time that data must be available and stable before the arrival of a clock edge 100. The hold time HT is the length of time that data to be clocked into the logic element must remain stable after the arrival of clock edge 100. Set-up times limit the maximum clock rate of a system. Positive hold times can cause malfunctioning at any clock rate. Thus, chip designers strive to provide zero or negative hold-time requirements.

The second example in FIG. 1 illustrates the input and output signals of a flip-flop that meets a zero-hold-time requirement. The data, a logic one at the onset of rising edge 110, propagates through the selected logic element to raise the output signal OUT to a logic one. The third example illustrates the input and output signals of a flip-flop that fails to meet a zero-hold-time requirement. The data, a logic one at the onset of rising edge 120, does not initiate the requisite logic one output signal OUT.

The time required for the output of a sequential logic element to change states in response to a clock is termed the "clock-to-out" delay. When two systems (e.g., two ICs) communicate synchronously, the data source must guarantee a minimum clock-to-out delay if the receiving device has a positive hold-time requirement. IC manufacturers prefer to provide short clock-to-out delays, but may be unable or unwilling to guarantee some minimum clock-to-out delay to compensate for a positive hold-time requirement. Any input hold time requirement is, therefore, an invitation to system failure. For a more detailed discussion of clock-to-out delays, including methods of measuring them, see U.S. Pat. No. 6,233,205 to Wells et al., which is incorporated herein by reference.

Figure 2:
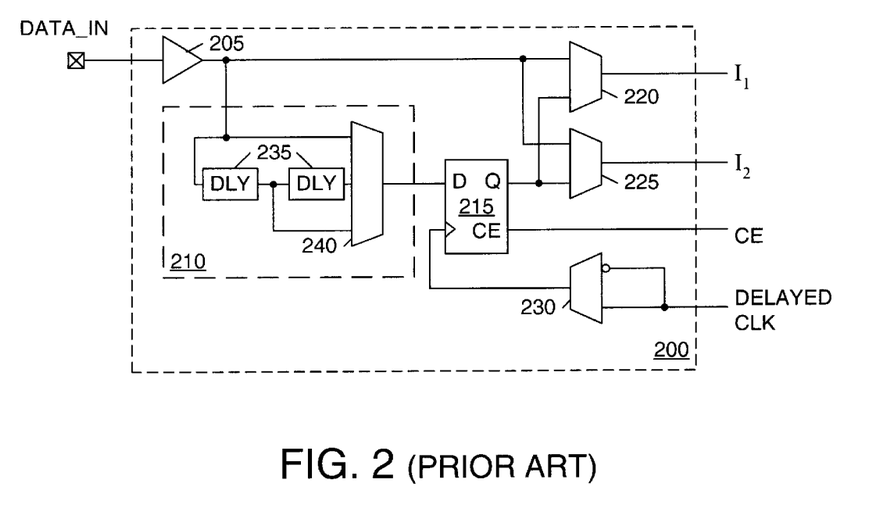
FIG. 2 (prior art) illustrates a conventional programmable input block 200 that addresses potential hold-time problems.

FIG. 2 illustrates a conventional programmable input block 200 that addresses potential hold-time problems. (Input block 200 is part of an input/output block on a Xilinx XC4000 field-programmable gate array.) Input block 200 includes an input buffer 205, a programmable delay circuit 210, a sequential logic element 215, and three programmable multiplexers 220, 225, and 230. A programmable multiplexer 240 within delay circuit 210 can be programmed to insert none, one or both of delay elements 235 into the incoming data path to compensate for clock delays induced by relatively long signal paths in the clock distribution network. Multiplexer 230 includes both inverting and non-inverting inputs, allowing logic element 215 to clock on either positive or negative clock edges.

Figure 3:
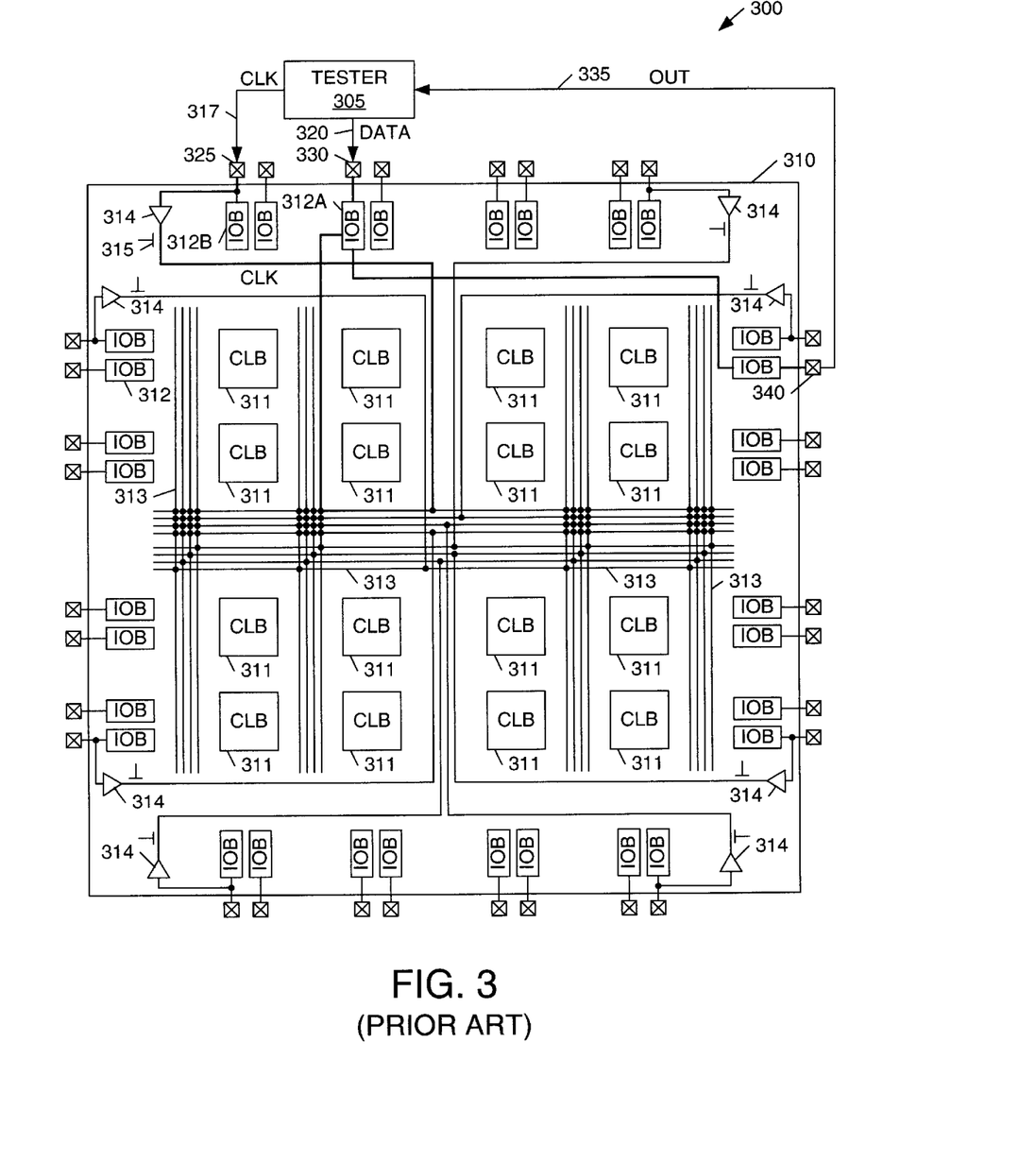
FIG. 3 (prior art) depicts a conventional test configuration 300 for ensuring that a selected sequential logic element on a programmable logic device meets a zero-hold-time requirement.

FIG. 3 depicts a conventional test configuration 300 for ensuring that a selected sequential storage element on a programmable logic device meets a zero-hold-time requirement. System 300 includes a conventional tester 305 connected to a field-programmable gate array (FPGA) 310.

FPGA 310 is a well-known type of programmable logic device, and might be one of the Spartan™ or Virtex™ series of FPGAs available from Xilinx, Inc., of San Jose, Calif. FPGA 310 includes an array of configurable logic blocks 311, or CLBS, that are programmably interconnected to each other and to programmable input/output blocks 312 (IOBs). This collection of configurable logic may be customized by loading configuration data into internal configuration memory cells that define how the CLBS, interconnections, and IOBs are configured. FPGA 310 additionally includes a clock distribution network 313 that can be connected to an external clock source (not shown) via eight global clock buffers 314 located in the four corners of FPGA 310. Each global clock buffer 314 has a corresponding pass transistor for gating an external clock signal to the input terminal of the respective clock buffer. For example, a pass transistor 315 selectively gates the signal on an input pin 325 through one of clock buffers 314 to clock distribution network 313. The signal on input pin 325 is additionally available to IOB 312B.

Clock distribution network 313 can be programmably connected to any of CLBs 311 or IOBs 312. In the depicted example, clock distribution network 313 connects input pin 325 to an input terminal of IOB 312A.

Tester 305 includes a pair of output leads 317 and 320 connected to respective input/output pins 325 and 330 of FPGA 310. Tester 305 also includes an input line 335 connected to an input/output pin 340 of FPGA 310. Tester 305 simultaneously applies input signals to pins 325 and 330 and monitors the output signal on line 335 to determine whether the correct data on line 320 clocks into IOB 312A. An incorrect logic level on line 335 indicates a hold-time violation.

Conventional test configuration 300 fails to provide acceptable levels of accuracy because tester 305 is typically too imprecise to effectively measure set-up and hold times. For example, while tester 305 may be able to place edges with nanosecond precision, set-up and hold times in leading-edge processes can be much shorter, e.g. a few tenths of a nanosecond.

Systems and methods have been proposed for quickly and accurately testing sequential logic elements on programmable logic devices for zero-hold-time compliance. See, for example, U.S. Pat. No. 6,239,611, issued to Michael M. Matera on May 29, 2001, entitled "Circuit and Method for Testing Whether a Programmable Logic Device Complies With a Zero-Hold-Time Requirement," which is incorporated herein by reference. In that example, a programmable logic device is configured such that both the data and clock terminals of a selected sequential logic element connect to an input pin of the programmable logic device, and the output terminal of the sequential logic element connects to an output pin of the programmable logic device. A circuit tester connected to the input pin then generates a signal transition on the input pin so that the signal transition traverses the data and clock paths in a race to the sequential logic element. The circuit tester also includes an input terminal that monitors the PLD output pin to determine whether the logic element contains the correct data after the logic element is clocked. Incorrect data stored in the sequential logic element after the logic element is clocked indicates that the clock signal arrived too soon, and therefore that the logic element violated the zero-hold-time requirement in the specified configuration.

The above-described method is a specialized, easily implemented go/no-go test that works well to test for zero hold time compliance. However, the method does not work on all architectures, and does not provide a measure of set-up time.

SUMMARY

The present invention is directed to a system and method for quickly and accurately measuring the timing requirements of sequential logic elements on programmable logic devices. In accordance with one embodiment, programmable interconnect resources are configured to deliver a pair of test signals to the data and clock terminals of each logic element under test. A variable delay circuit places signal edges on the clock (data) terminal a precise, known delay before or after corresponding signal edges on the data (clock) terminal. A tester then monitors the data clocked into the logic element to determine whether the logic element functions properly with the given delay. This process is continued over a number of selected delays to determine the maximum and minimum timing requirements of the element under test.

Timing requirements for a given logic element may differ depending on whether the data represents a logic zero or a logic one. Some embodiments therefore provide means of separately measuring timing requirements for clocking both rising and falling data edges using either rising or falling clock edges. Still other embodiments accurately measure clock-to-out delays of sequential logic elements.

This summary does not limit the invention, which is instead defined by whatever claims issue.

DETAILED DESCRIPTION

Figure 4A:
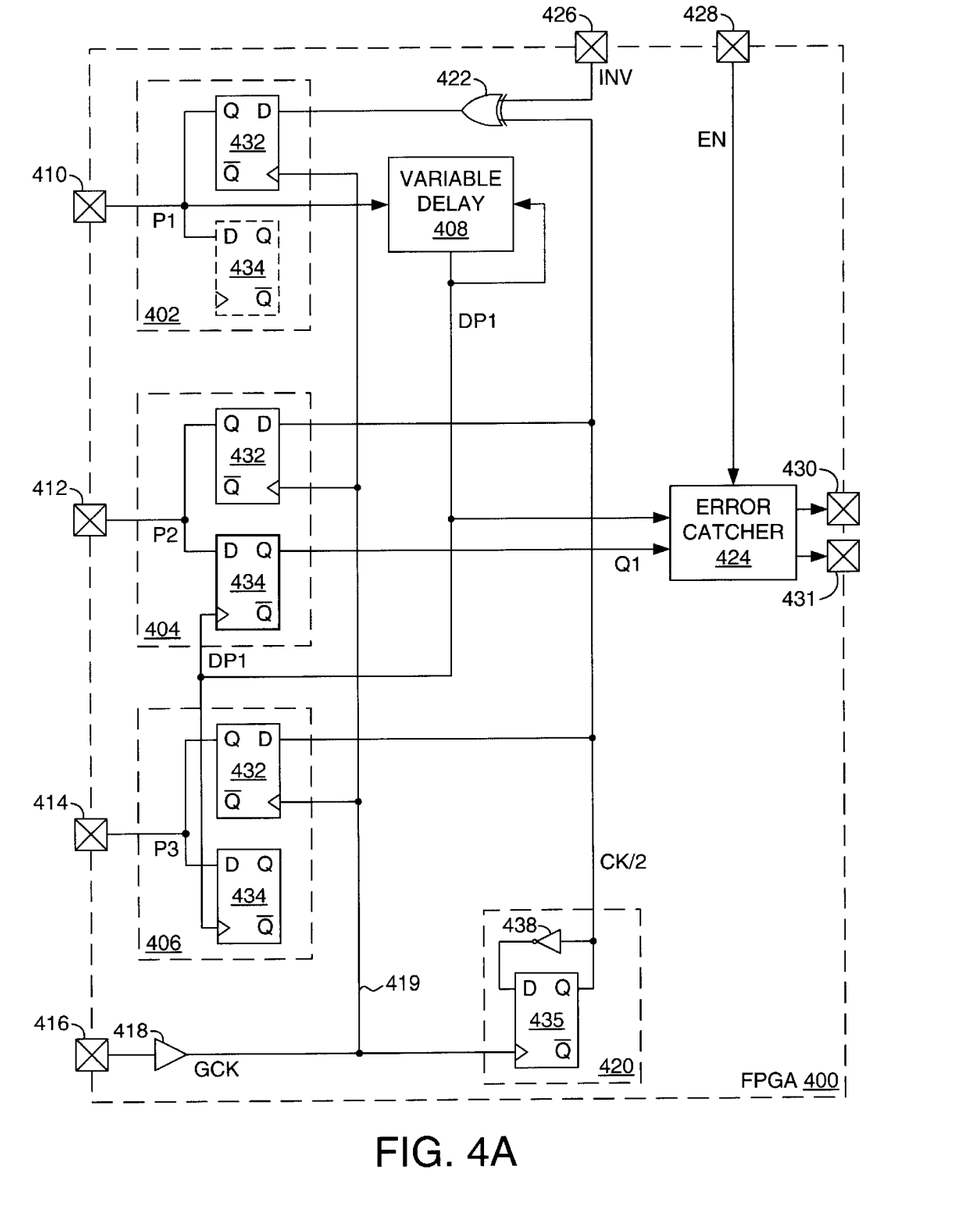
FIG. 4A depicts an FPGA 400 configured in accordance with an embodiment of the invention to accurately measure the set-up and hold time of sequential logic elements.

FIG. 4A depicts a field-programmable gate array (FPGA) 400 configured in accordance with an embodiment of the invention to accurately measure the set-up and hold time of sequential logic elements. Sequential logic elements of interest (e.g., input flip-flops) include two input terminals, a data terminal and a clock terminal. In accordance with embodiments of the invention, each input terminal receives a respective test signal composed of a series of rising and falling signal edges. A variable delay circuit connected to one of the input terminals places the signal edges on the respective terminal a precise time before or after the corresponding edges on the other input terminal. The edges placed on the input terminals then "race" to their respective destinations. Varying the delay separating corresponding signal edges on the two input terminals while monitoring the storage element for storage errors provides measures of set-up and hold time. These and other aspects of the invention are detailed below.

FPGA 400 conventionally includes three exemplary IOBs 402, 404, and 406, each of which is connected to a respective one of input/output pads 410, 412, and 414. FPGA 400 additionally includes a variable-delay circuit 408 and some configurable logic (e.g., CLBs) programmed to instantiate a clock divider 420 and an error catcher 424. FPGA 400 may be, for example, a member of the Virtex-II™ family of FPGAs available from Xilinx, Inc.

Each of IOBs 402, 404, and 406 includes a pair of sequential logic elements, depicted here as an output flip-flop 432 and an input flip-flop 434. FPGA 400 is configured in the manner shown to measure the set-up and hold times of input logic elements 434 within IOBs 404 and 406. The following discussion focuses on the input logic element 434 of IOB 404 for brevity, but the same test methods can be applied to IOB 406 or to the many other input logic elements generally available (though not shown) on FPGAs similar to FPGA 400.

A circuit, such as a conventional tester of the type discussed in connection with FIG. 3, issues a global clock signal GCK on an input/output pad 416. A clock buffer 418 and clock network 419 convey the global clock signal to the clock terminals of each output flip-flop 432 and to the clock input of clock divider 420. Clock divider 420 is a divide-by-two toggle configuration that divides global clock GCK by two to provide a half-frequency clock CK/2 to one input of an XOR gate 422. XOR gate 422 can be instantiated in programmable logic.

In the present example, the external tester generates control signals on a pair of pins 426 and 428, which may be dedicated pins or general-purpose input/output pins. As described below in connection with FIG. 4B, the external tester is assumed to provide a logic zero on pin 426, so XOR gate 422 merely conveys the test signal CK/2 to the data terminal D of output flip-flop 432 of IOB 402. The synchronous output terminal Q of each output flip-flop 432 connects to an associated I/O pin and to the data input D of the input flip-flop 434 within the same IOB. The synchronous output terminals (Q) of each input logic element under test connect to an input of error catcher 424. Error catcher 424 produces output signals on I/O pins 430 and 431 that indicate to the external tester whether input logic elements under test always latched the appropriate data in response to an input clock signal. Only one error catcher is shown, but additional error catchers may be provided for other elements under test. Alternatively, error catcher 424 can include multiple input terminals to monitor more than one element under test.

Figure 4B:
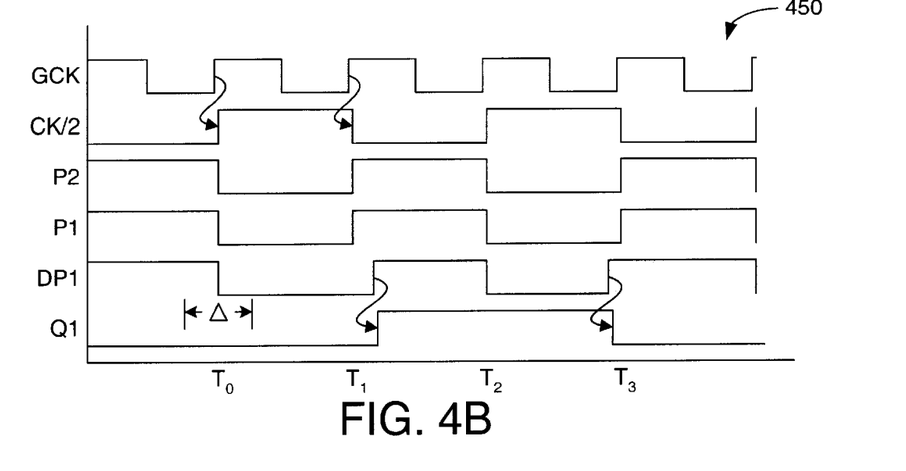
FIG. 4B is a waveform diagram 450 depicting the operation of FPGA 400 as configured in FIG. 4A.

FIG. 4B is a waveform diagram 450 depicting the operation of FPGA 400 as configured in FIG. 4A. Clock divider 420 divides the global clock GCK by two to provide test signal CK/2 to the data terminal of output flip-flop 432 in IOB 402. The data presented on the data input of that output flip-flop is clocked in on a rising edge of global clock GCK, so output flip-flop 432 of IOB 402 provides signal P1 on the like-named terminal of IOB 402. The same test signal CK/2 delivered to the D-input of output flip-flop 432 of IOB 402 is similarly delivered to the D-inputs of output flip-flops 432 of IOBs 404 and 406. Likewise, the same global clock signal GCK is delivered to the clock inputs of output flip-flops 432 in each of IOBs 402, 404, and 406. Thus configured, the signals P2 and P3 associated with each IOB 404 and 406, respectively, are identical, or nearly so, to the output signal on terminal P1.

In an embodiment in which FPGA 400 is a Virtex-II™ FPGA, variable delay circuit 408 is a digital clock management (DCM) circuit that includes a delay-locked loop. The DCM can be configured to impose a positive or negative delay on signal P1 in increments of about fifty picoseconds, as directed by the tester. The tester controls the phase delay of the DCM by issuing phase-step clock signals. For a detailed discussion of the digital clock management unit within a Virtex-II™ FPGA, see the advance product specification entitled "Virtex-II Pro™ Platform FPGAs: Introduction and Overview," [DS083-1 (v1.0) Jan. 31, 2002], which is incorporated herein by reference.

Due to the precision of the DCM, the tester will know with significant precision the time lapse between edges on node P1 and corresponding edges on node DP1; because signals P1 and P2 are virtually identical, the tester will also know with significant precision the time lapse between edges on terminal P2 and corresponding edges on node DP1. Assuming that the tester is testing the set-up and hold times for input flip-flop 434 of IOB 404 (the flip-flop 434 of interest is annotated using relatively bold boundaries), the tester—via variable delay circuit 408—precisely places edges on the respective data and clock terminals of the input flip-flop of interest.

In the example of FIG. 4B, the possibility of employing variable delay circuit 408 to place edges of test clock signal DP1 at different times relative to corresponding edges on signals P1 and P2 is illustrated using a cross hatched region to indicate possible timing of test signal DP1. At time T1, it is assumed that variable delay circuit 408 places the rising edge on terminal DP1 well behind the rising edge of signals P1 and P2. Input flip-flop 434 within IOB 404 therefore has ample set-up time to latch a logic one upon receipt of the rising edge on line DP1. Flip-flop 434 of IOB 404 will therefore provide the correct (logic one) logic level on output Q1 to error catcher 424. The opposite case is shown at time T3, in which case the rising clock edge on terminal DP1 occurs too soon to latch a logic one into input flip-flop 434 of IOB 404. In that case, the data arrives too late, and input flip-flop 434 of IOB 404 consequently returns to a logic zero. The resulting error state is conveyed to error catcher 424 via line Q1.

Diagram 450 is simplified for ease of illustration. In practice, events illustrated with respect to times T1, T2, and T3 will not necessarily occur in any sequence. Instead, there may be thousands of similar events in sequence before temperature changes, voltage fluctuations, and/or jitter produce sufficient timing changes to induce an error for capture by error catcher 424.

The purpose of the configuration of FIG. 4A is to measure the worst-case set-up and hold time requirements for flip-flops 434, which is to say the longest required set-up time and shortest required hold time. Hold time can be called a "negative" hold time if it occurs before the clock edge. To determine these worst-case values, variable-delay circuit 408 is used to vary the delay between data and clock edges. If, in the depicted configuration, the rising clock edge arrives too late, the output of the flip-flops 434 under test will always be high, or logic 1. Variable-delay circuit 408 can then be gradually adjusted to reduce the clock delay until flip-flop 434 occasionally produces a logic zero, which is captured by error catcher 424. The delay setting at which error catcher 424 first captures a logic zero is the measured set-up time. The tester remembers and reports this delay accordingly and disables error catcher 424.

The next step is to investigate the shortest set-up time, commonly called "hold time." The tester reduces the delay through variable-delay circuit 408 to zero, and enables error-catcher 424. Assuming a negative hold time, the Q output of each flip-flop 434 will be high. (If the flip-flop 434 of interest exhibits a positive hold time, variable-delay circuit 408 can start with a negative delay instead of a zero delay.) As the delay through circuit 408 is increased (i.e., moves in the positive direction), line Q1 from the flip-flop of interest will eventually go high for the first time. Error catcher 424 notes this event; the tester remembers and reports this delay as the negative hold-time (if the delay induced by variable-delay circuit 408 is positive).

Figure 5:
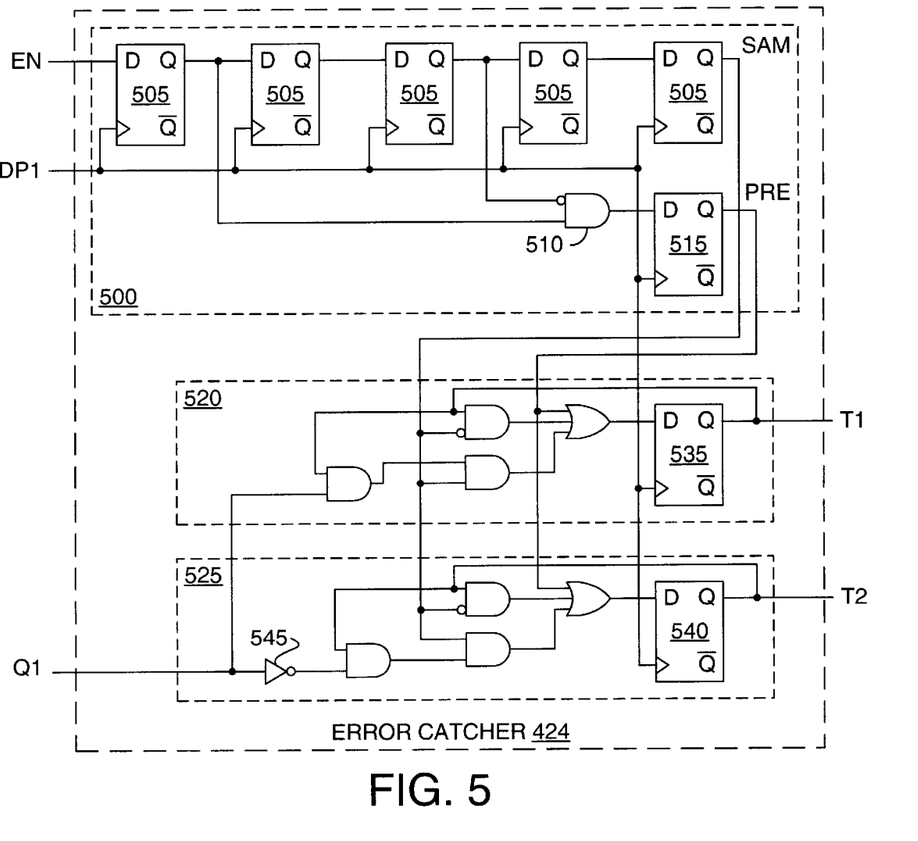
FIG. 5 depicts an embodiment of error catcher 424 of FIG. 4A.

FIG. 5 depicts an embodiment of error catcher 424 of FIG. 4A. Error catcher 424 includes a control circuit 500 that develops a pair of control signals SAM (for "sample") and PRE (for "preset") in response to an enable signal EN, typically from an external tester. Control circuit 500 includes flip-flops 505 arranged in series to shift the enable signal to the SAM terminal. An AND gate 510 and flip-flop 515 produce a preset signal on line PRE that goes high, remains high for two clock cycles, and returns low before sample terminal SAM goes high. The sample signal remains high for five clock cycles after the enable signal is de-asserted.

Error catcher 424 also includes, for each Q output from an input flip-flop under test, a pair of error samplers 520 and 525. Error samplers 520 and 525 respectively include flip-flops 535 and 540 and some combinatorial logic. Error sampler 525 also includes an inverter 545, but is otherwise identical to error sampler 520. For brevity, error samplers are omitted for other Q outputs (e.g., for the output from IOB 406 of FIG. 4A). Error catcher 424 can easily be expanded for use with additional Q outputs by adding pairs of error samplers like error samplers 520 and 525. Control circuit 500 can also control additional error samplers.

In operation, the preset signal PRE sets each of flip-flops 535 and 540 to logic one. Flip-flops 535 and 540 then output logic ones and zeroes, depending on the level provided on terminal Q1, for the duration of the logic one level on sample line SAM. The levels provided on output terminals T1 and T2 from flip-flops 535 and 540 indicate whether flip-flop 434 of IOB 404 stored the appropriate data for each clock period. Terminals T1 and T2 connect to the tester via respective pins 430 and 431 (FIG. 4A).

In the configuration depicted in FIG. 4A, and assuming a voltage level representative of a logic one on pin 426, output terminal Q1 from IOB 404 should be a logic one if the test clock signal on line DP1 meets the set-up and hold time requirements for the respective flip-flop 434. In such a case, flip-flop 535 will produce an uninterrupted sequence of logic-one levels during the sample period, and flip-flop 540 will produce an uninterrupted sequence of logic-zero levels. If, however, the test signal on line DP1 misses the set-up or hold time window for one or more of the many clock periods during the sample window, then a logic zero (low) on D input terminal of flip-flop 520 forces a continuous low on terminal T1.

Flip-flop 535 is configured as an active-low "zeros catcher" and 540 is an active-low "ones catcher" used to test the set-up/hold time window of the falling-edge data. Error catcher 424 remembers set-up or hold time violations that occur during the assertion of the sample signal on line SAMPLE. At the same time, the tester can monitor and/or modify parameters of interest, such as supply voltage, temperature, and the delay imposed by variable-delay circuit 408.

The external tester can be used to determine the set-up and hold-time requirements for input logic element 434 of IOB 404. For example, the external tester might first cause variable delay circuit 408 to provide coincident signals on the clock and data terminals of the logic element under test. The tester then issues an enable signal EN on pin 428 and monitors the resultant output signals from pins 430 and 431. The Q output of the logic element under test (e.g., Q1) should be low, as there is no set-up time when the data and clock signals are coincident. The tester then incrementally adjusts variable delay circuit 408 to move the edges of signal DP1 relative to signal P2 and repeats the test. (In one embodiment, variable delay circuit 408 can impose delay in increments of about 50 picoseconds, depending upon the clock speed.) The tester can repeat this process until output Q1 remains high throughout the test period. The minimum delay required to invariably produce a logic one on output Q1 is the longest set-up time for flip-flop 434 of IOB 404. The process can be repeated to measure the shortest hold time.

The accuracy and precision of set-up and hold-time measurements in accordance with the depicted embodiment are limited by the timing granularity provided by variable delay circuit 408. Set-up and hold time requirements vary from one device to the next, due to process variations, for example. Moreover, the set-up and hold time requirements for a given device will vary with temperature and supply voltage. The methods and circuits described above can be used to document these variations with significant accuracy and precision. In addition, the method can be modified for production testing to verify that each device of interest meets some minimum requirement.

Routing limitations in the circuit of FIG. 4A preclude connecting node P1 directly to node P2; otherwise, the input flip-flop 434 of IOB 404 could be tested by inserting variable delay circuit 408 between the clock and data nodes of the input flip-flop under test.

In the foregoing example, the data latched into flip-flops 434 are always supposed to be logic ones. Set-up and hold times may differ for the rising or falling edge of data. XOR gate 422 allows for independent testing of rising and falling edges of data. The external tester can provide a logic one on pin 426 so that XOR gate 422 inverts the test signal CK/2 to the data terminal D of output flip-flop 432 of IOB 402. The test procedures outlined above are then repeated with the expectation that input logic elements will latch logic zeroes when their set-up and hold requirements are met.

Figure 6A:
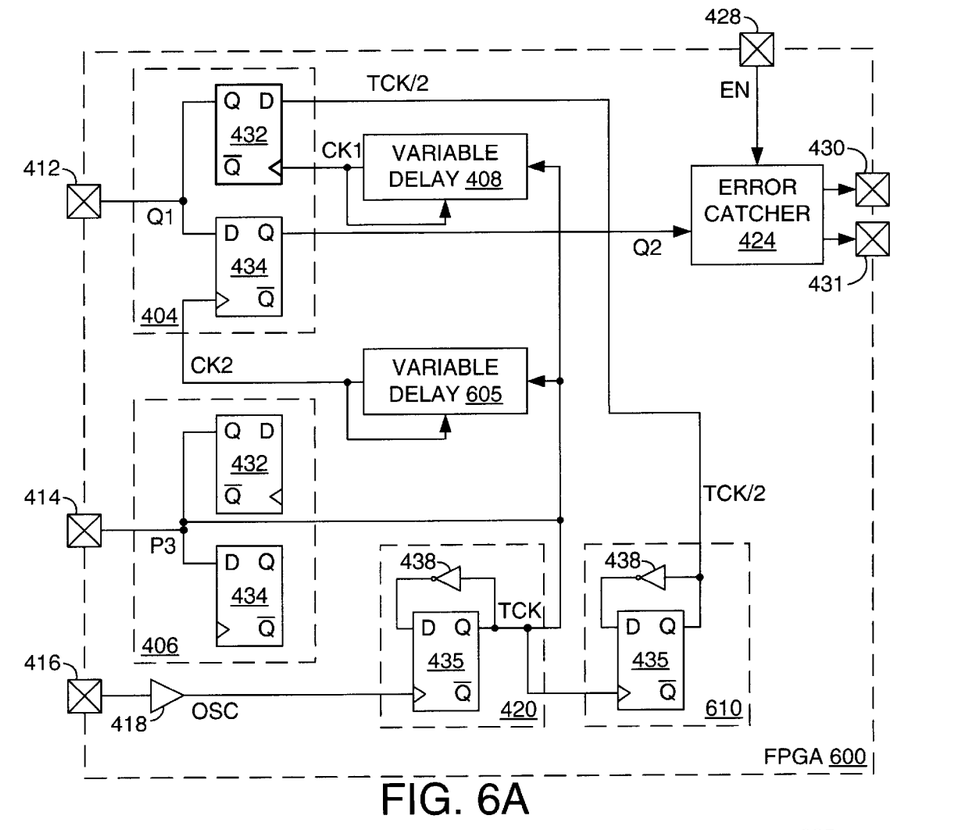
FIG. 6A depicts an FPGA 600 configured in accordance with an embodiment of the invention to accurately measure the clock-to-out delay of sequential logic elements.

FIG. 6A depicts an FPGA 600 configured in accordance with an embodiment of the invention to accurately measure the clock-to-out delays of sequential logic elements. FPGA 600 is physically identical to FPGA 400 of FIG. 4A, like-named elements being the same, but is configured to instantiate a different test configuration. Some elements depicted in FIG. 4A are absent in FIG. 6A and additional elements are present. FPGA 600 is configured to test the clock-to-out delay of output flip-flop 432 of IOB 404, which is highlighted with a bold border.

An external tester (not shown) provides an oscillating signal OSC to FPGA 600 via I/O pad 416. Clock divider 420 divides the oscillating signal OSC by two to produce a test clock signal TCK, which is routed to a pair of identical variable delay circuits 408 and 605 and to a second clock divider 610. Clock divider 610 divides test-clock signal TCK by two and provides the resulting signal TCK/2 to the data input D of the flip-flop 432 under test. Variable delay circuit 408 provides a first version of the test clock signal (CK1) to the clock terminal of the flip-flop under test, while delay circuit 605 provides a second version of the test clock signal (CK2) to the clock terminal of input flip-flop 434 of IOB 404. Both variable delay circuits 408 and 605 can be adjusted with considerable precision to provide a known timing difference between CK1 and CK2.

Figure 6B:
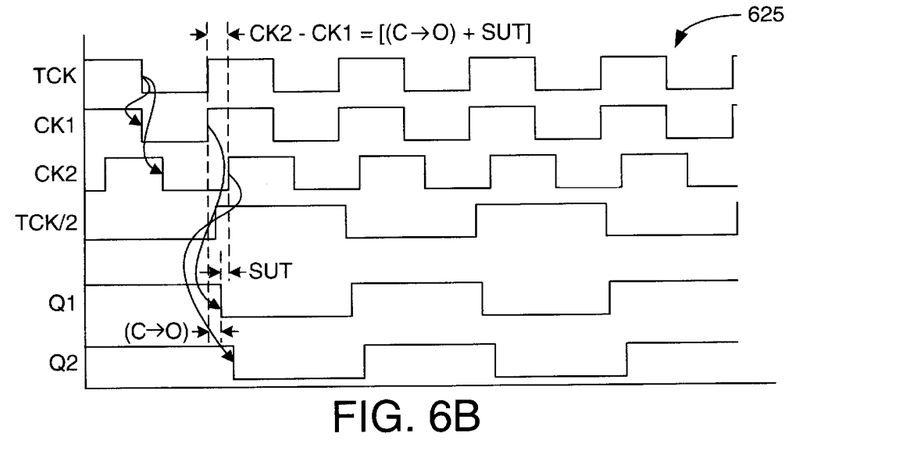
FIG. 6B is a waveform diagram 625 employed to describe the operation of FPGA 600 of FIG. 6A.

FIG. 6B is a waveform diagram 625 employed to describe the operation of FPGA 600 of FIG. 6A. In the example, delay circuit 408 includes a DLL and is adjusted so that signal CK1 is substantially identical to test clock signal TCK (i.e., variable delay circuit 408 imposes zero delay). Thus configured, flip-flop 432 within IOB 404 stores the logic level of signal TCK/2 upon the rising edge of the test clock signal CK1. The resulting signal Q1 can be observed on I/O pin 412, and is conveyed to the D input terminal of input flip-flop 434 in IOB 404. As in the example of FIG. 4A, a selective inverter can be inserted in the line TCK/2 if desired.

The clock-to-out delay of the output flip-flop 432 under test is the parameter of interest. In other words, the purpose of the test is to measure the time required for data present on the D input terminal of the flip-flop under test to appear on the corresponding Q output terminal in response to a clock edge. Then, assuming the data on Q1 arrives soon enough to meet the set-up requirements of the associated input flip-flop 434, input flip-flop 434 will store the data on terminal Q1 and provide the result on line Q2 to an input of error catcher 424. (In an embodiment in which error catcher 424 is as depicted in FIG. 5, line Q2 of FIG. 6A connects to the input Q1 of the error catcher depicted in FIG. 5.)

Variable delay circuit 605 introduces some delay, and data on terminal Q1 arrives sufficiently in advance of the rising edges on clock signal CK2 to meet the set-up requirement of flip-flop 434. Output Q2 therefore transitions in response to the rising edges of signal CK2. The minimum delay between rising edges on signal CK2 and a correct signal transition on terminal Q2 is the minimum required set-up time of the input flip-flop 434 involved in the test.

Variable delay circuit 605 is adjusted until the delay imposed is the minimum for which flip-flop 434 produces correct data on terminal Q2. In this condition, the time lapse between edges of signals CK1 and CK2 is the sum of the clock-to-out delay C->O of flip-flop 432 and the minimum set-up time SUT of input flip-flop 434. Stated mathematically, $$CK2-CK1 = [(C\text{->}0) + SUT] \quad (1)$$

or $$C\text{->}0 = (CK2-CK1) - SUT \quad (2)$$

The tester sets the delays imposed by variable delay circuits 408 and 605, and consequently knows the value of the difference CK2−CK1. Furthermore, the set-up time SUT for flip-flop 434 can be determined using the methods described above in connection with FIGS. 4A and 4B. The clock-to-out delay C->0 of flip-flop 432 is therefore easily computed by substituting CK2−CK1 and SUT with their known values and solving equation 2.

In each of the forgoing embodiments, the data routing through the input and output storage elements retains its logic level. For example, logic one data on line TCK/2, if conveyed uncorrupted through flip-flops 432 and 434, is presented to error catcher 424 as a logic one. As will be understood by those of skill in the art, however, the logic level used to represent data may be changed without impacting the validity of the measurements (e.g., the input flip-flop 434 could connect to error catcher 424 via the inverting /Q output, the D input terminal of flip-flop 434 can be configured as inverting, or the output from flip-flop 432 could be taken from the /Q output).

Figure 7:
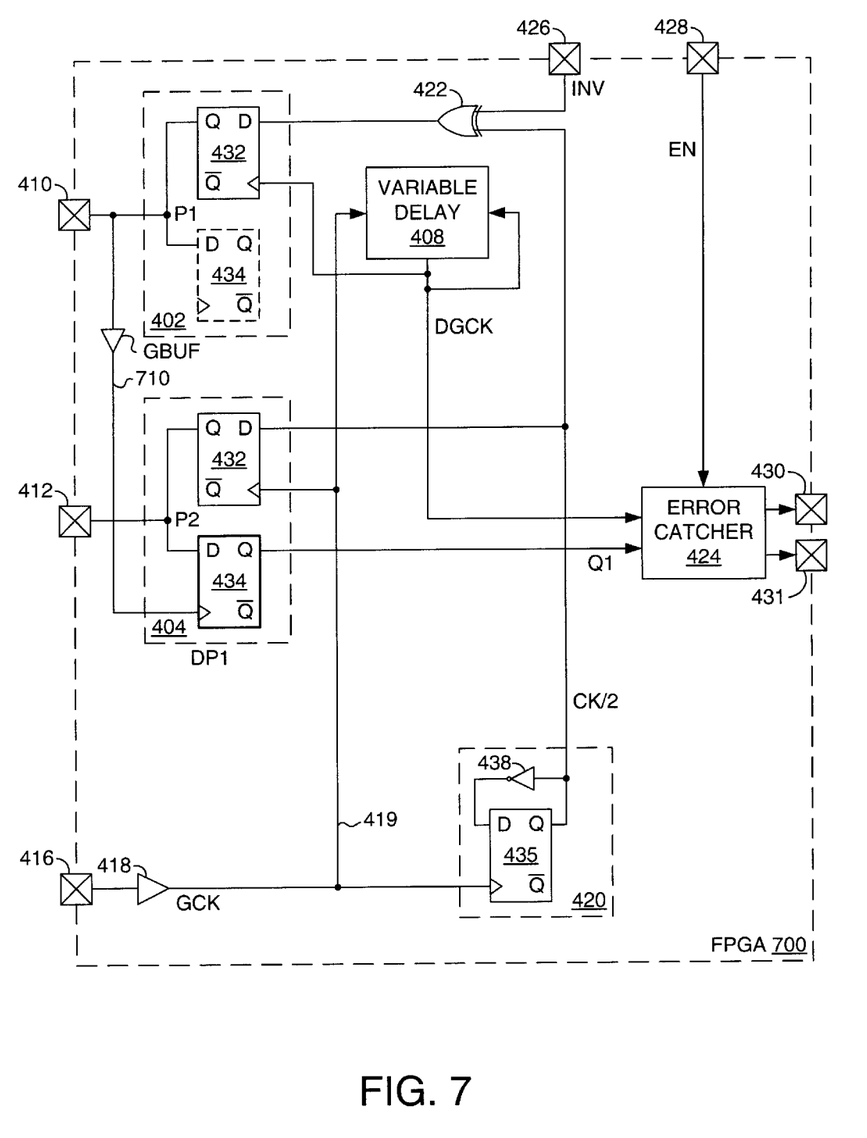

Most high-speed designs will use some form of clock compensation, such as that provided by a delay-locked loop. Other designs may not use a compensated clock-distribution network, so it may be of interest to characterize the set-up and hold times of input flip-flops in the absence of a compensated clock. FIG. 7 depicts an embodiment of the invention directed to making such characterizations.

FIG. 7 depicts an FPGA 700 configured in accordance with an embodiment of the invention to accurately measure the set-up and hold times of input flip-flops 434 in the absence of a compensated global clock. FPGA 700 is physically identical to FPGA 400 of FIG. 4A, like-named elements being the same, but is configured to instantiate a different test configuration. Some elements depicted in FIG. 4A are absent in FIG. 7 and additional elements are present. The flip-flop of interest is input flip-flop 434 of IOB 404, which is highlighted with a bold border.

FPGA 700 includes a number of global clock distribution networks. A portion of one global clock distribution network extends from pin 416 to clock divider 420, output flip-flop 432 of IOB 404, and variable delay element 408. A portion of a second global clock distribution network extends from pin 410 to the clock terminal of input flip-flop 434 of IOB 404 via a global clock buffer GBUF and a clock line 710.

Any clock delay imposed by buffer GBUF and clock line 710 moves both set-up and hold times of the input flip-flop 434 under test to a later moment, which is to say the clock delay reduces the set-up time and moves the hold time in a positive direction. As depicted in FIG. 2, IOB 404 can include a programmable delay circuit 210. Delay elements 235 can be inserted into the data path of an input flip-flop (e.g., flip-flops 434) to compensate for clock delays. The configuration of FPGA 700 can be used to analyze the set-up and hold times of flip-flops 434 with and without additional data delays.

Variable delay element 408 produces a delayed version of global clock signal GCK on line 419, and presents the resulting delayed clock DGCK to the clock terminal of output flip-flop 432 of IOB 402. The configuration of FPGA 700 functions in much the same was at the configurations discussed above in connection with FIGS. 4A and 6A. In the example of FIG. 7, clock and data edges are presented on the respective clock and data terminals of the input flip-flop 434 under test. Adjusting variable delay element 408 moves the edges presented on terminal P1, and consequently on the clock terminal of the flip-flop 434 under test. The clock edges can therefore be moved relative to the respective data edges to determine what amounts of positive and/or negative delays imposed by delay element 408 produce set-up and hold-time errors. This information can be used, as noted above, to determine the set-up and hold time requirements for the element under test.

While the present invention has been described in connection with specific embodiments, variations of these embodiments will be obvious to those of ordinary skill in the art. For example:

a. routing resources permitting, the foregoing tests can be extended to sequential logic elements inside the device or even in a different device; and b. a variable delay element can be provided in the data path instead of or in addition to the clock path of a circuit under test to move clock edges relative to data edges.

Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A programmable logic device comprising:
   a. an input/output pad;
   b. an input logic element having:
      i. a sequential input-logic-element input terminal connected to the input/output pad;
      ii. an input-logic-element clock terminal; and
      iii. a sequential input-logic-element output terminal;
   c. an output logic element having:
      i. a sequential output-logic-element output terminal connected to the input/output pad;
      ii. a sequential output-logic-element input terminal; and
      iii. an output-logic-element clock terminal;
      iv. wherein the output logic element is adapted to provide an alternating test signal on the output-logic-element output terminal; and
   d. a variable delay circuit having:
      i. a variable-delay-circuit input terminal adapted to receive a version of the test signal; and
      ii. a variable-delay-circuit output terminal connected to the input-logic-element clock terminal and adapted to provide a delayed test clock signal to the input-logic-element clock terminal.

2. The programmable logic device of claim 1, wherein the variable delay circuit can be adjusted to obtain coincidence between edges of the test signal and edges of the delayed test clock signal.

3. The programmable logic device of claim 1, further comprising an error catcher having an error-catcher input terminal connected to the sequential input-logic-element output terminal.

4. The programmable logic device of claim 1, further comprising a global clock network connected to the output-logic-element clock terminal.

5. The programmable logic device of claim 4, further comprising a clock divider having:
   a. a clock-divider input terminal connected to the global clock network; and
   b. a clock-divider output terminal connected to the sequential output-logic-element input terminal.

6. The programmable logic device of claim 1, further comprising a second output logic element, the second output logic element having:
   a. a second sequential output-logic-element output terminal connected to the variable-delay-circuit input terminal;
   b. a second sequential output-logic-element input terminal; and
   c. a second output-logic-element clock terminal.

7. The programmable logic device of claim 6, further comprising a global clock network connected to the first-mentioned output-logic-element clock terminal and the second output-logic-element clock terminal.

8. The programmable logic device of claim 6, wherein the second sequential output-logic-element input terminal connects to the variable-delay-circuit output terminal.

9. The programmable logic device of claim 1, further comprising a second variable-delay-circuit having:
   a. a second variable-delay-circuit input terminal adapted to receive the version of the test signal; and
   b. a second variable-delay-circuit output terminal connected to the output-logic-element clock terminal.

10. A method of measuring set-up times for a sequential logic element on a programmable logic device, the method comprising:
   a. programming the programmable logic device to establish the connections specified in claim 1;
   b. controlling the timing of the delayed test clock signal relative to the test signal; and
   c. monitoring the sequential input-logic-element output terminal.

11. A programmable logic device comprising:
   a. a variable delay circuit having:
      i. a variable-delay-circuit input terminal adapted to receive a first test signals including a first series of signal edges; and
      ii. a variable-delay-circuit output terminal adapted to provide a second test signal including a second series of signal edges, each of the signal edges delayed with respect to a corresponding one of the first series of signal edges; and
   b. an input logic element including:
      i. a first input-logic-element input terminal adapted to receive the second series of signal edges;
      ii. a second input-logic-element input-terminal adapted to receive a third series of signal edges derived from the first series of signal edges; and
      iii. an input-logic-element output terminal.

12. The programmable logic device of claim 11, further comprising an error catcher connected to the input-logic-element output terminal.

13. The programmable logic device of claim 11, wherein the first input-logic-element input terminal is a clock terminal and the second input-logic-element input terminal is a data terminal.

14. The programmable logic device of claim 11, further comprising an input/output pin connected to the second input-logic-element input terminal.

15. The programmable logic device of claim 11, wherein the input logic element is a portion of a programmable input/output block.

16. The programmable logic device of claim 15, wherein the input/output block includes an output flip-flop having an output-flip-flop output terminal connected to the second input-logic-element input terminal.

17. The programmable logic device of claim 11, wherein the second and third series of signal edges are derived from the first series of signal edges.

18. A system for testing set-up and hold time requirements for the programmable logic device of claim 11, the system comprising a tester connected to the programmable logic device and adapted to control the variable delay circuit to provide a plurality of signal propagation delays.

* * * * *